(12) United States Patent
De Vries et al.

(10) Patent No.: US 8,129,097 B2
(45) Date of Patent: Mar. 6, 2012

(54) IMMERSION LITHOGRAPHY (75) Inventors: Dirk De Vries, Eindhoven (NL); Richard Moerman, Son (NL); Cédric Désiré Grouwstra, Eindhoven (NL); Michel Franciscus Johannes Van Rooy, Bladel (NL)

(73) Assignee: ASML Netherlands B.V., Veldhoven (NL)

( * ) Notice: Subject to any disclaimer, the term of this patent is extended or adjusted under 35 U.S.C. 154(b) by 563 days.

(21) Appl. No.: 12/318,033

(22) Filed: Dec. 19, 2008

(65) Prior Publication Data

US 2009/0170041 A1   Jul. 2, 2009

Related U.S. Application Data (60) Provisional application No. 61/006,243, filed on Jan. 2, 2008.

(51) Int. Cl.
*G03F 7/26* (2006.01)

(52) U.S. Cl. ............... 430/322; 430/22; 430/30

(58) Field of Classification Search ............ 430/322, 430/30, 22, 311
See application file for complete search history.

(56) References Cited

U.S. PATENT DOCUMENTS

| | | | |
|---|---|---|---|
| 4,509,852 A | 4/1985 | Tabarelli et al. ............ 355/30 |
| 7,480,050 B2 | 1/2009 | Den Boef et al. | |
| 7,630,053 B2 | 12/2009 | Kawamura | |
| 2002/0060296 A1* | 5/2002 | Van Der Veen ............ 250/492.1 |
| 2004/0136494 A1 | 7/2004 | Lof et al. ............ 378/34 |
| 2004/0207824 A1 | 10/2004 | Lof et al. ............ 355/30 |
| 2006/0066855 A1* | 3/2006 | Boef et al. ............ 356/401 |
| 2006/0189779 A1* | 8/2006 | Allen et al. ............ 528/40 |
| 2007/0182964 A1 | 8/2007 | Den Boef et al. | |
| 2007/0196566 A1 | 8/2007 | Takeishi et al. | |
| 2007/0229789 A1 | 10/2007 | Kawamura | |

FOREIGN PATENT DOCUMENTS

| | | |
|---|---|---|
| EP | 1 420 300 | 5/2004 |
| JP | 64-026131 | 1/1989 |
| JP | 2007-220890 | 8/2007 |
| JP | 2007-243164 | 9/2007 |
| JP | 2007-266074 | 10/2007 |
| WO | WO 99/49504 | 9/1999 |

OTHER PUBLICATIONS

Japanese Office Action mailed Jun. 2, 2011 in corresponding Japanese Patent Application No. 2008-328877.

\* cited by examiner

*Primary Examiner* — Kathleen Duda
*Assistant Examiner* — Caleen Sullivan
(74) *Attorney, Agent, or Firm* — Pillsbury Winthrop Shaw Pittman LLP (57) ABSTRACT

A method of obtaining information related to a defect present in the irradiation of a substrate coated with a layer of radiation sensitive material using immersion lithography is disclosed. The method includes irradiating an area of the radiation sensitive material with a non-patterned radiation beam, the area being irradiated with a dose which is sufficient for the radiation sensitive material to be substantially removed during subsequent development of the radiation sensitive material if the radiation sensitive material is a positive radiation sensitive material, or with a dose which is sufficient for the radiation sensitive material to be substantially insoluble during subsequent development of the radiation sensitive material if the radiation sensitive material is a negative radiation sensitive material. The method further includes developing the radiation sensitive material and obtaining information at least indicative of the topography of radiation sensitive material remaining on the substrate after the radiation sensitive material has been developed in order to obtain information related to the defect.

18 Claims, 8 Drawing Sheets

IMMERSION LITHOGRAPHY

This application claims priority and benefit under 35 U.S.C. §119(e) to U.S. Provisional Patent Application No. 61/006,243, entitled "Immersion Lithography", filed on Jan. 2, 2008. The content of that application is incorporated herein in its entirety by reference.

FIELD

The present invention relates to immersion lithography. In particular, the present invention relates to a method and apparatus for obtaining information at least indicative of a defect present in an immersion lithography process, and/or a defect on a substrate caused by the defect in the process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid may be distilled water, although another liquid could be used. The description herein references a liquid. However, another fluid may be suitable, particularly a wetting fluid, an incompressible fluid and/or a fluid with a higher refractive index than air, desirably a higher refractive index than water. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

However, submersing the substrate, or substrate and substrate table, in a bath of liquid (see, for example, U.S. Pat. No. 4,509,852) means that there is a large body of liquid that must be accelerated during a scanning exposure. This may mean that additional or more powerful motors are required to move the substrate and/or substrate table. Furthermore, turbulence in the liquid may lead to undesirable and unpredictable effects.

Figure 2:
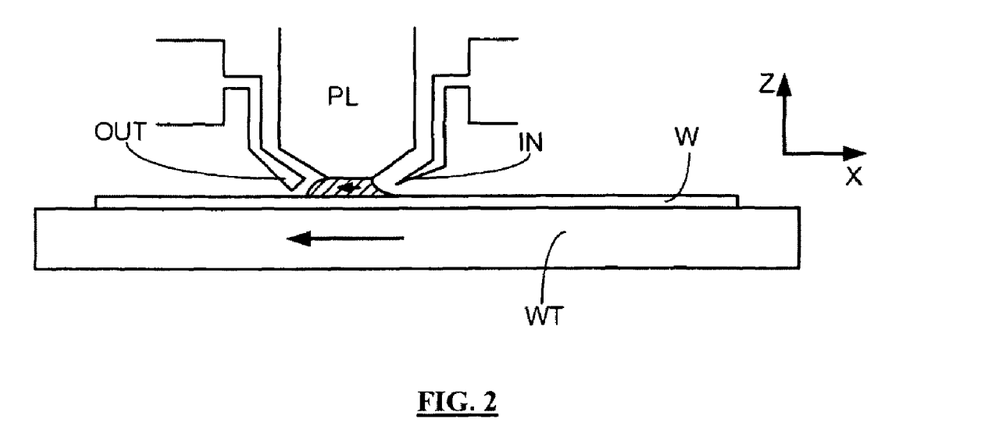
FIGS. 2 and 3 schematically depict an embodiment of a liquid supply system used in a lithographic projection apparatus.
Figure 3:
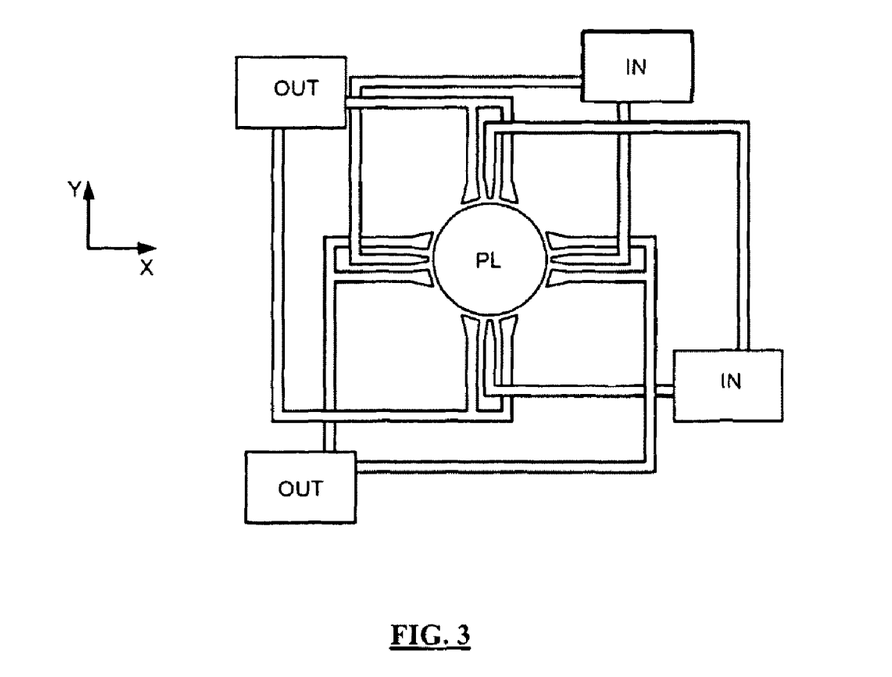

One of the solutions proposed is for a liquid supply system to provide liquid on only a localized area of the substrate and in between the final element of the projection system PL and the substrate using a liquid confinement system (the substrate generally has a larger surface area than the final element of the projection system). A possible implementation of this solution is disclosed in PCT patent application publication no. WO 99/49504. As illustrated in FIGS. 2 and 3 herein, liquid is supplied by at least one inlet IN onto the substrate W, preferably along the direction of movement of the substrate relative to the final element PL, and is removed by at least one outlet OUT after having passed under the projection system PL. That is, as the substrate W is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of inlets and outlets positioned around the final element are possible; one example is illustrated in FIG. 3 in which four sets of an inlet with an outlet on either side are provided in a regular pattern around the final element.

A problem encountered with immersion lithographic machines is the occurrence of contaminating particles within the immersion system and on the surface of the substrate. The presence of a particle in the immersion system may cause a defect to occur during the exposure process when the particle is present between the projection system and the substrate being exposed. The same problem may be encountered if bubbles form in the immersion fluid and/or on the surface of, for example, resist provided on the substrate.

SUMMARY

It is desirable, for example, to reduce optimally the presence of particles in the immersion system, and/or at least obtain information indicative of a defect so that it may be better understood with the aim of reducing its occurrence or number. It is desirable, for example, to provide a new or alternative method and apparatus that may obviate or mitigate at least one disadvantage of the prior art, whether mentioned herein or elsewhere.

According to an aspect of the present invention, there is provided a method of obtaining information related to a defect present in the irradiation of a substrate coated with a layer of radiation sensitive material using immersion lithography, the method comprising: irradiating an area of the radiation sensitive material with a non-patterned radiation beam, the area being irradiated with a dose which is sufficient for the radiation sensitive material to be substantially removed during subsequent development of the radiation sensitive material if the radiation sensitive material is a positive radiation sensitive material, or with a dose which is sufficient for the radiation sensitive material to be substantially insoluble during subsequent development of the radiation sensitive material if the radiation sensitive material is a negative radiation sensitive material; developing the radiation sensitive material; and obtaining information at least indicative of the topography of radiation sensitive material remaining on the substrate after the radiation sensitive material has been developed in order to obtain information related to the defect.

According to another aspect of the invention, there is provided an apparatus arranged to obtain information related to a defect present in the irradiation of a substrate coated with a layer of radiation sensitive material using immersion lithography, the apparatus comprising: an immersion lithographic apparatus arranged to irradiate an area of the radiation sensitive material with a non-patterned radiation beam, the area being irradiated with a dose which is sufficient for the radiation sensitive material to be substantially removed during subsequent development of the radiation sensitive material if the radiation sensitive material is a positive radiation sensitive material, or which is sufficient for the radiation sensitive material to be substantially insoluble during subsequent development of the radiation sensitive material if the radiation sensitive material is a negative radiation sensitive material; a development apparatus arranged to develop the radiation sensitive material; and an arrangement configured to obtain information indicative of the topography of radiation sensitive material remaining on the substrate after the radiation sensitive material has been developed in order to obtain information related to the defect.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
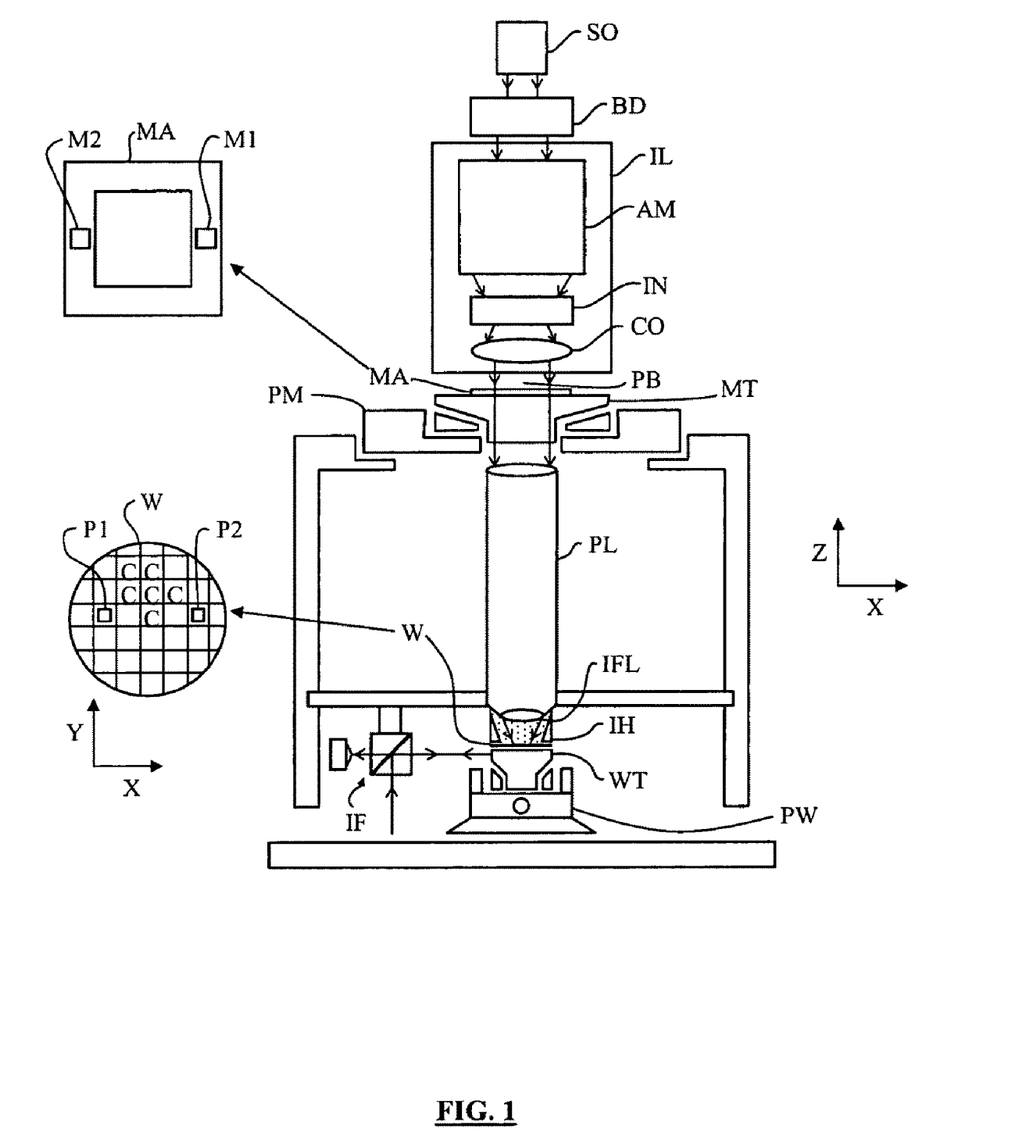
FIG. 1 schematically depicts a lithographic apparatus according to an embodiment of the present invention.

FIG. 1 schematically depicts an embodiment of lithographic apparatus suitable for use with an embodiment of the invention. The apparatus comprises:

an illumination system (illuminator) IL configured to condition a radiation beam B (e.g. ultraviolet (UV) radiation, deep ultraviolet (DUV) radiation or extreme ultraviolet (EUV) radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters;

a projection system (e.g. a refractive projection lens system) PS configured to project a pattern imparted to the radiation beam B by patterning device MA onto a target portion C (e.g. comprising one or more dies) of the substrate W; and an immersion head IH (sometimes referred to as an immersion hood) configured to at least partly retain a volume of immersion fluid IFL between the projection system PS (e.g. a lens) and the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W as the beam passes through the immersion fluid IFL. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
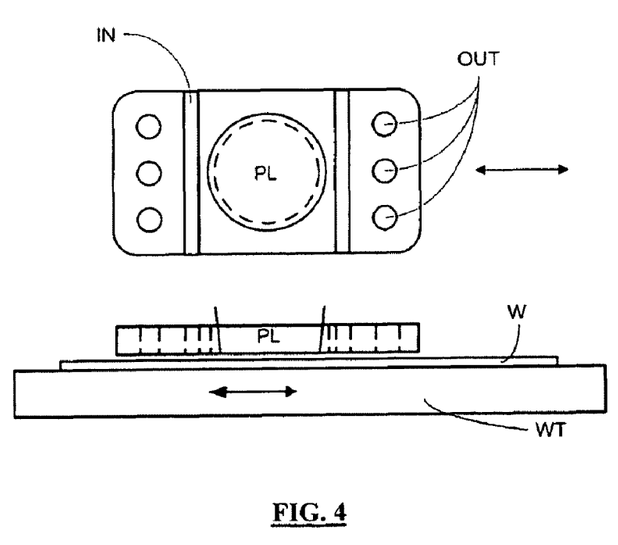
FIG. 4 schematically depicts an embodiment of a liquid supply system used in a lithographic projection apparatus.

An immersion lithography arrangement with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and outlets OUT can be arranged in a plate with a hole in its centre and through which the projection system PL (e.g. a lens) may project. Liquid is supplied by one groove inlet IN on one side of the projection system PL and removed by a plurality of discrete outlets OUT on the other side of the projection system PL. This causes a flow of a thin film of liquid between the projection system PL and the substrate W. The choice of which combination of inlet IN and outlets OUT to use can depend on the direction of movement of the substrate W (the other combination of inlet IN and outlets OUT being, for example, inactive).

Figure 5:
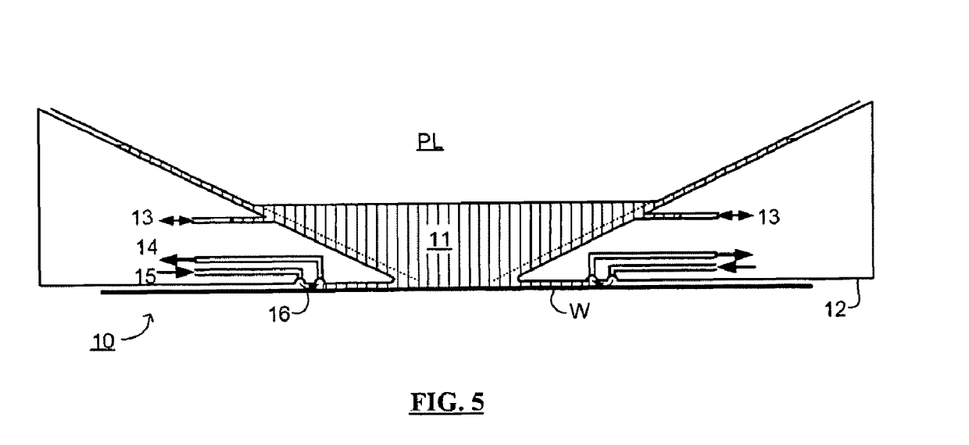
FIG. 5 schematically depicts an embodiment of a liquid supply system.

Another immersion lithography arrangement with a localized liquid supply system has been proposed. This arrangement provides the liquid supply system with a barrier member (or so-called immersion hood) which extends along at least a part of a boundary of the space between the final element of the projection system PL and the substrate table or substrate W. Such a solution is illustrated in FIG. 5. The barrier member is substantially stationary relative to the projection system PL in the XY plane though there may be some relative movement in the Z direction (in the direction of the optical axis). A seal may be formed between the barrier member 12 and the surface of the substrate table or substrate W. In an embodiment, the seal is a contactless seal such as a gas seal.

Referring to FIG. 5, a barrier member 12 forms a contactless seal to the substrate W around the image field of the projection system PL so that liquid (e.g. immersion fluid) is confined to fill a reservoir 11 between the substrate surface and the final element of the projection system PL. The reservoir 11 is formed by a barrier member 12 positioned below and surrounding the final element of the projection system PL. Liquid is brought into the space below the projection system and within the barrier member 12. The liquid may be brought into the space and/or removed from the space by means of port 13. The barrier member 12 extends a little above the final element of the projection system PL and the liquid rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and substrate and extracted via first outlet 14. The overpressure on the gas inlet 15, vacuum level on the first outlet 14 and geometry of the gap are arranged so that there is a high-velocity gas flow inwards that confines the liquid. Such a system is disclosed in United States patent application publication no. US 2004-0207824.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Other immersion lithography arrangements are possible and one or more embodiments of the present invention are equally applicable to those. For example, in place of the gas seal 16 it is possible to have a single phase extractor which substantially only extracts liquid. Radially outwardly of such a single phase extractor could be one or more features to produce a gas flow to help contain the liquid in the space. One such type of feature might be a so-called gas knife in which a thin jet of gas is directed towards and onto the substrate W. During scanning motion of the substrate relative to the projection system and the liquid supply system, hydrostatic and hydrodynamic forces may be generated which result in a pressure on the liquid towards the substrate.

With a localized area liquid supply system, the substrate W is moved relative to the projection system PL and the liquid supply system. The relative movement of the substrate table WT may be to enable an edge of the substrate W to be imaged, or for a sensor on the substrate table WT to be imaged for sensing purposes or for a substrate swap. Substrate swap is removal and replacement of the substrate W from the substrate table WT between exposures of different substrates. During substrate swap it may be desirable for liquid to be kept within the liquid confinement system 12. This may be achieved by moving the liquid confinement system 12 relative to the substrate table WT, or vice versa, so that the liquid confinement system is placed over a surface of the substrate table WT away from the substrate W. Such a surface may be a shutter member. Immersion liquid may be retained in the liquid confinement system by operating the gas seal 16 or by clamping the surface of the shutter member to the undersurface of the liquid confinement system 12. The clamping may be achieved by controlling the flow and/or pressure of fluid provided to the undersurface of the liquid confinement system 12. For example, the pressure of gas supplied from the inlet 15 and/or the under pressure exerted from the first outlet 14 may be controlled.

The surface of the substrate table WT over which the liquid confinement system 12 is located may be an integral part of the substrate table 12 or it may be a detachable and or replaceable component of the substrate table 12. Such a detachable component may be referred to as closing plate or a dummy substrate. The detachable or separable component may be a separate stage. In a dual or multi stage arrangement the entire substrate table 12 is replaced at the exposure position during substrate exchange. In such an arrangement the detachable component may be transferred between substrate tables. The shutter member may be an intermediate table that may be moved adjacent to the substrate table WT prior to substrate exchange. The liquid confinement system may then be moved onto the intermediate table, or vice versa, during substrate exchange. The shutter member may be a moveable component of the substrate table, such as a retractable bridge, which may be positioned between the substrate tables during substrate exchange. The surface of the shutter member may be moved under the liquid confinement structure, or vice versa, during substrate exchange.

During substrate swap, an edge of the substrate W will pass under the space 11 and liquid may leak into the gap between the substrate W and substrate table WT. This liquid may be forced in under hydrostatic or hydrodynamic pressure or the force of a gas knife or other gas flow creating device. A drain may be provided around the edge of a substrate W, such as in the gap. A drain may be located around another object on the substrate table. Such an object may include, but is not limited to, one or more sensors and/or a shutter member as described above. Thus, any reference to the substrate W should be considered to be synonymous with any such other object, including a sensor or shutter member.

Figure 6A:
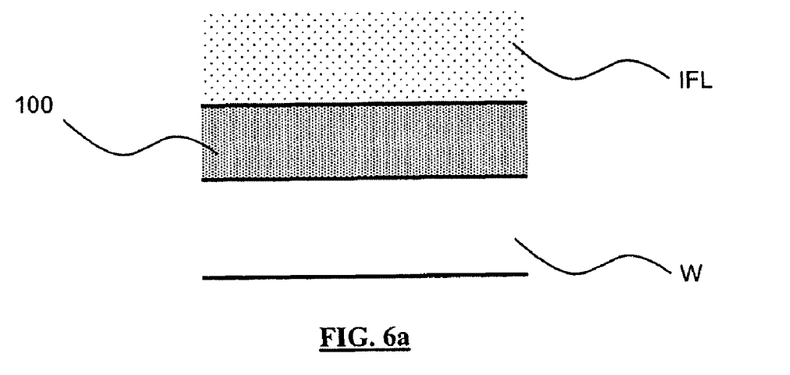
FIGS. 6a-6c schematically depict an immersion lithography method.
Figure 6B:
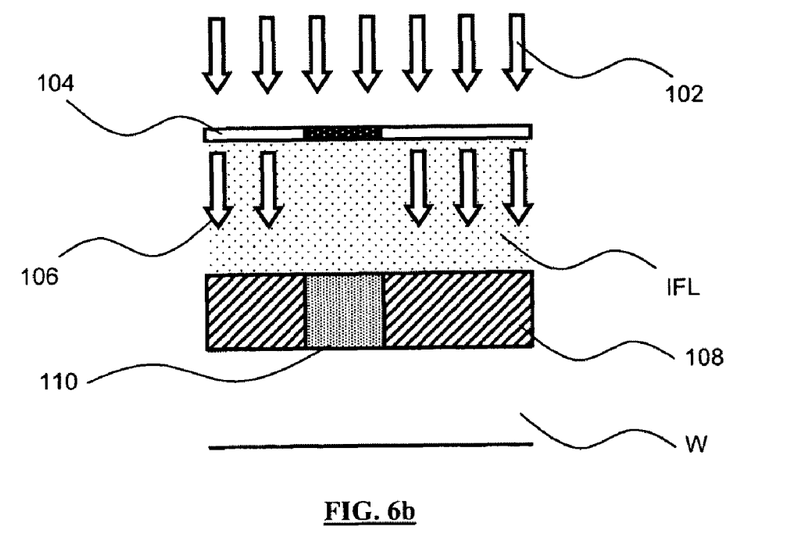
Figure 6C:
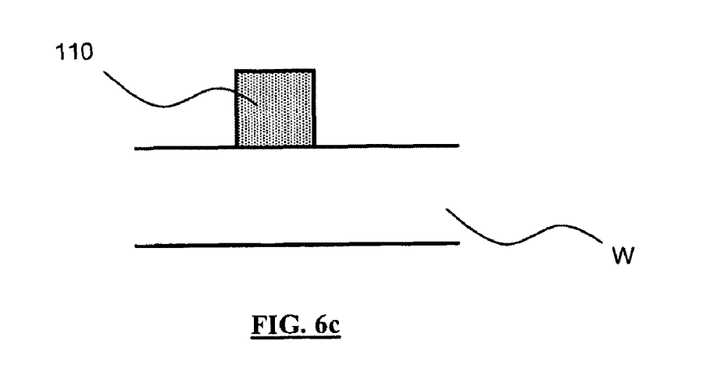

FIGS. 6a-6c schematically depict a theoretical immersion lithography process. FIG. 6a shows a substrate W with an area of resist 100 deposited thereon. The resist 100 is to be exposed to a radiation beam through an immersion fluid IFL which is in contact with the resist, as described in more detail above.

FIG. 6b shows a radiation beam 102 directed towards a patterning device (e.g., a mask) 104. The patterning device 104 is arranged to selectively allow or prevent the radiation beam 102 from traversing it. The part of the radiation beam 102 which traverses the patterning device 104 will therefore have a pattern imparted in its cross-section and will therefore be a patterned radiation beam 106. The patterned radiation beam 106 then passes through the immersion fluid IFL before the patterned radiation beam 106 is incident upon the resist. The part 108 of the resist upon which the patterned radiation beam 106 is incident will be chemically affected by the patterned radiation beam 106. The irradiated part 108 of the resist is irradiated with a sufficient amount of radiation such that, when the resist is subsequently developed, the irradiated part of the resist 108 is dissolved. This is sometimes referred to as giving the resist a dose known as the "dose to clear". A non-irradiated part 110 of the resist is not chemically affected by the patterned radiation beam 106, and does not therefore become soluble in developer. Therefore, in a subsequent development of the resist, the non-irradiated part 110 of the resist remains on the substrate W.

FIG. 6c shows the substrate W after developer solution has been used to dissolve an irradiated part of the resist. It can be seen that the non-irradiated part of the resist 110 remains on the substrate.

Figure 7A:
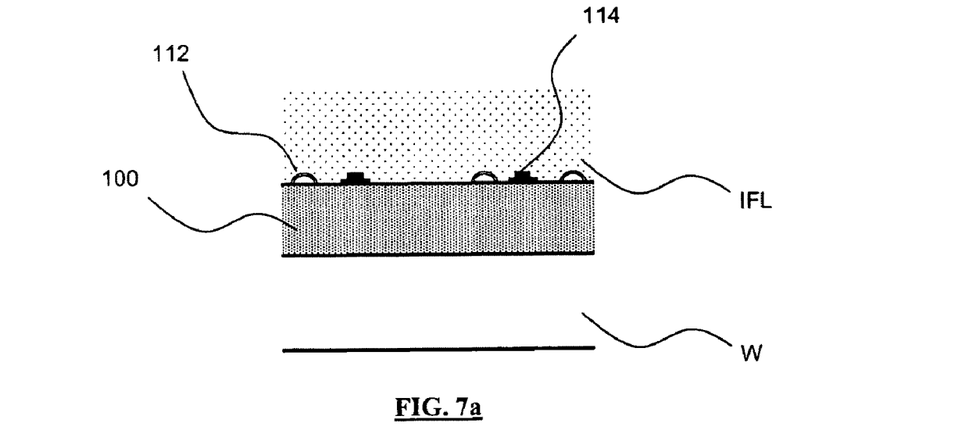
FIGS. 7a-7c schematically depict a problem associated with an immersion lithography method.
Figure 7B:
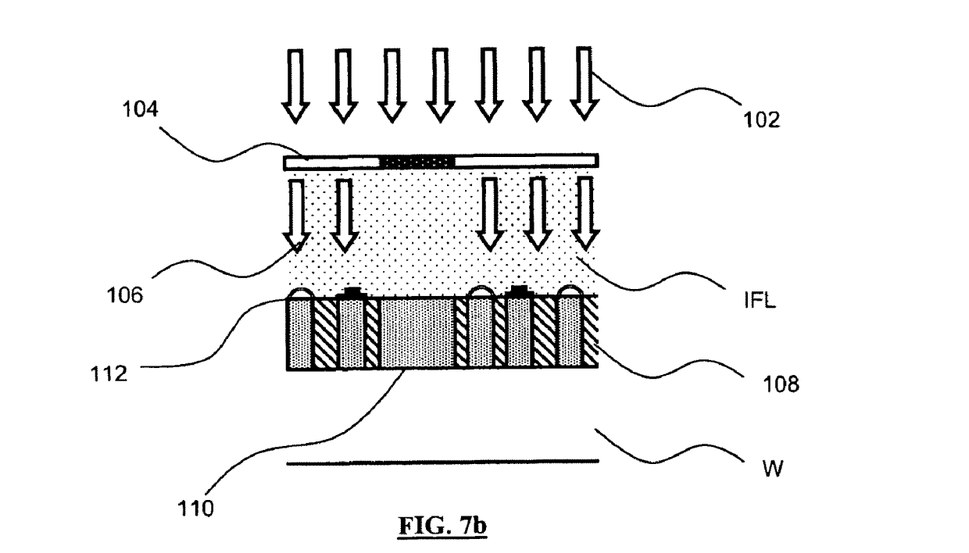
Figure 7C:
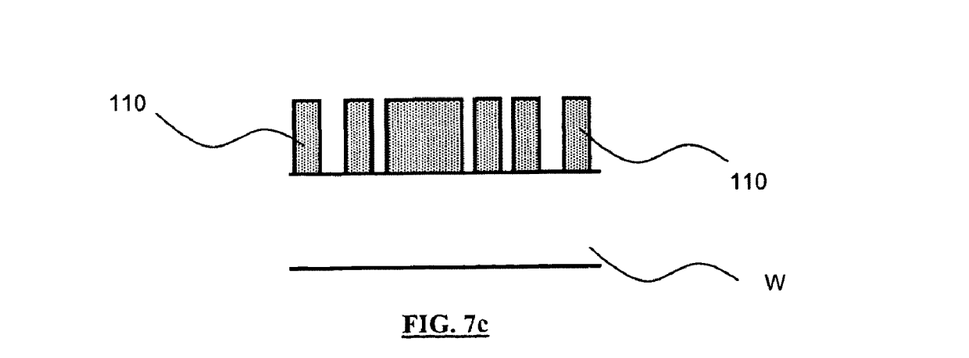

In FIGS. 6a-6c, and also in FIGS. 7 and 8 to be described further below, the immersion fluid IFL is shown as being located in between the patterning device 104 and the substrate W. As described above, this is not necessary. In an embodiment the immersion fluid could be located between the projection system (or the last element in the projection system) and the substrate. FIGS. 6 and 7 are given as schematic representations of an immersion lithography process, and are used as simplified examples of how an immersion lithography process may be undertaken.

As mentioned above, FIGS. 6a-6c describe a simplified and theoretical immersion lithography process. For instance, it can be seen from FIGS. 6a-6c and the description thereof that no defects have been mentioned or referred to. In practice, however, a defect in the patterned resist provided on the substrate is a problem frequently encountered in immersion lithography. One of the reasons for the creation of such a defect is because of the fact that the immersion fluid is in contact with the resist. In some cases, the immersion fluid may interact with the resist and cause part of it to break off in molecular or particle form. Alternatively or additionally, bubbles may form in the immersion fluid or on top of the resist provided on the substrate, as may fluid marks. Such contamination, bubbles and/or marks are defects which may cause a defect in the pattern applied to the resist on the substrate using a patterned radiation beam, as will now be described with reference to FIGS. 7a-7c.

FIG. 7a shows the substrate W with a layer of resist 100 provided thereon. In contact with the resist 100 is the immersion fluid IFL. Interaction between the immersion fluid IFL and the resist 100 has caused one or more bubbles 112 and one or more particles 114 to become deposited on the layer of resist 100.

FIG. 7b shows the radiation beam being pattered by the patterning device 104 to provide a patterned radiation beam 106. The patterned radiation beam 106 passes through the immersion fluid IFL and onto the resist. It can be seen that where the radiation beam 102 does not traverse the patterning device 104, a corresponding area 110 of resist underneath the patterning device 104 is not irradiated. However, in addition to the non-irradiated part 110 of the resist caused by the pattern of the patterning device 104, the bubbles 112 and particles 114 also prevent the patterned radiation beam 106 from irradiating a part of the resist. This means that the area 108 of resist that is radiated is not as intended. In other words, the pattern projected onto the resist will have a defect in it, in that an area of the resist that should have been irradiated is not in fact irradiated.

FIG. 7c shows the situation after the resist has been developed. It can be seen that a plurality of areas 110 of resist which were not irradiated have not been developed, and that they remain on the substrate. The areas of resist which remain on the substrate due to the presence of the bubbles 112 and particles 114 are defects, since they do not correspond to the intended pattern formed in the patterning device 104.

A defect in or of the pattern applied to a layer of resist may have one or more of a number of consequences. For instance, the defect may prevent a device or a layer of a device formed by the patterned layer of resist from working properly, or working at all. The defect which is formed in the resist corresponds to a defect in the lithographic process, for instance the presence of a bubble, a fluid mark, contamination, etc. It is therefore desirable to reduce or eliminate such a defect. It is desirable to obtain information as to the number, location, etc. of these defects, and how the defect forms with different immersion lithography criteria. Such information may be used by those working in the field of immersion lithography to tune or optimize the immersion lithography apparatus and method. The information may also or alternatively be used to determine the operational state or health of an immersion lithography apparatus or method.

A method for obtaining information indicative of the number, position, size, type, etc. of defects involves the comparison of images of patterns applied to different areas of the resist. By comparing more than one of these images, defect information can be obtained. For example, if images from two different areas of resist are compared, and these two areas of resist have the same pattern applied to them, any differences can be attributed to a defect. The number, position, size, shape, etc. of these defects can then be catalogued or used, for example, to determine how the location, position, shape, size, etc. of these defects change with different immersion lithography conditions (e.g. different field size, resist, immersion fluid, substrate scan speed, etc.).

Although this method of identifying a defect from a comparison of images of patterns applied to the substrate is useful, it may have one or more disadvantages. Firstly, it may take a long time to obtain information indicative of a defect across the substrate using such images, for example, 20-30 minutes or more. When exposing layers of resist on the substrate, time is critical, since any wasted time may reduce the throughput of the lithographic apparatus. Furthermore, with this method, it may not be possible to determine whether any defect in the patterns in the resist are caused by a particle, a bubble, etc. (i.e. a defect) in the immersion fluid or on the resist, or from contamination elsewhere in the lithographic apparatus, for example on the patterning device. A further disadvantage is that, when comparing different patterned areas of the resist to obtain information at least indicative of the defect, the patterns should be applied in a consistent manner. This would mean trying to ensure that the patterns are in focus, meaning that the radiation beam is focused on the patterning device. The focusing process can also take time, further reducing the throughput of the lithographic apparatus. A yet further disadvantage is that the equipment used to obtain and compare images of patterned areas of resist in order to identify the defect is expensive.

Figure 8A:
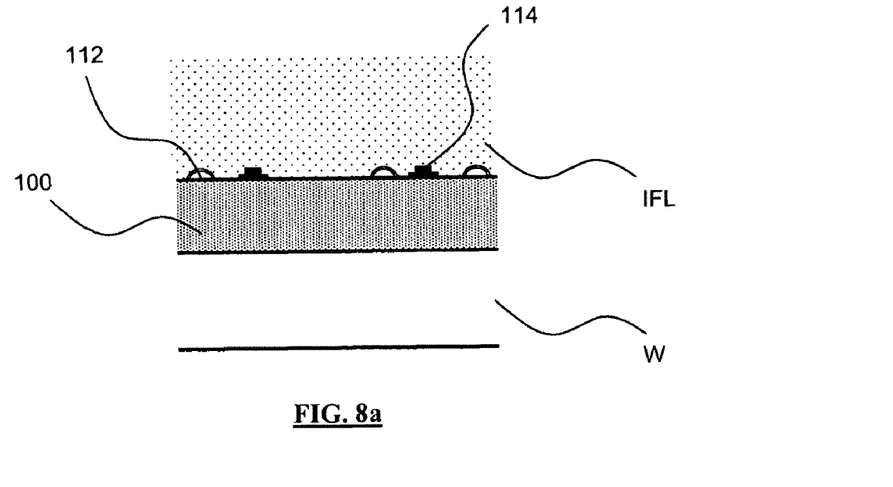
FIGS. 8a-8c schematically depict part of a method for obtaining information indicative of a defect in an immersion lithography process in accordance with an embodiment of the present invention.
Figure 8B:
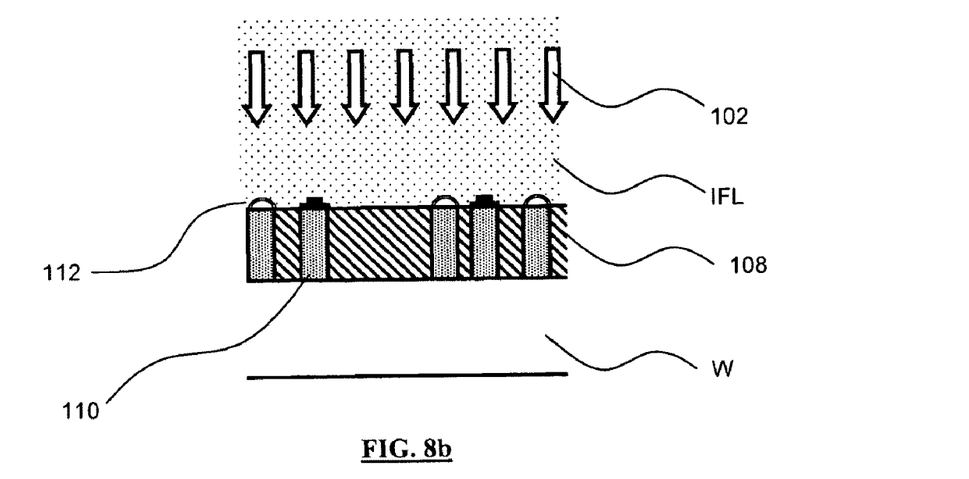
Figure 8C:
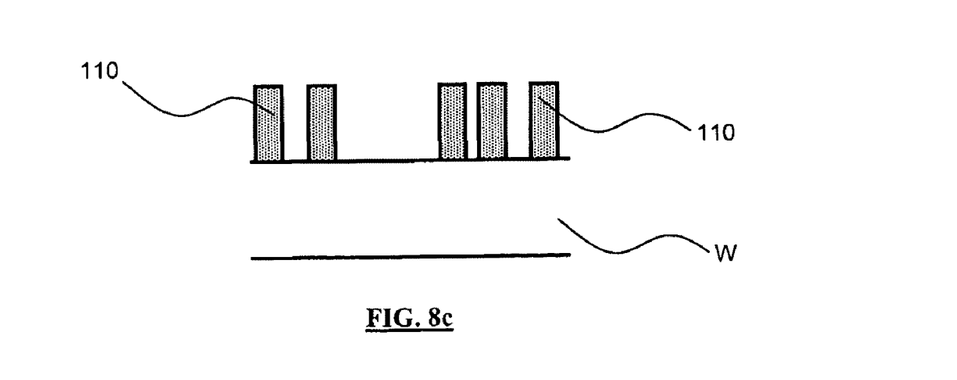
Figure 9:
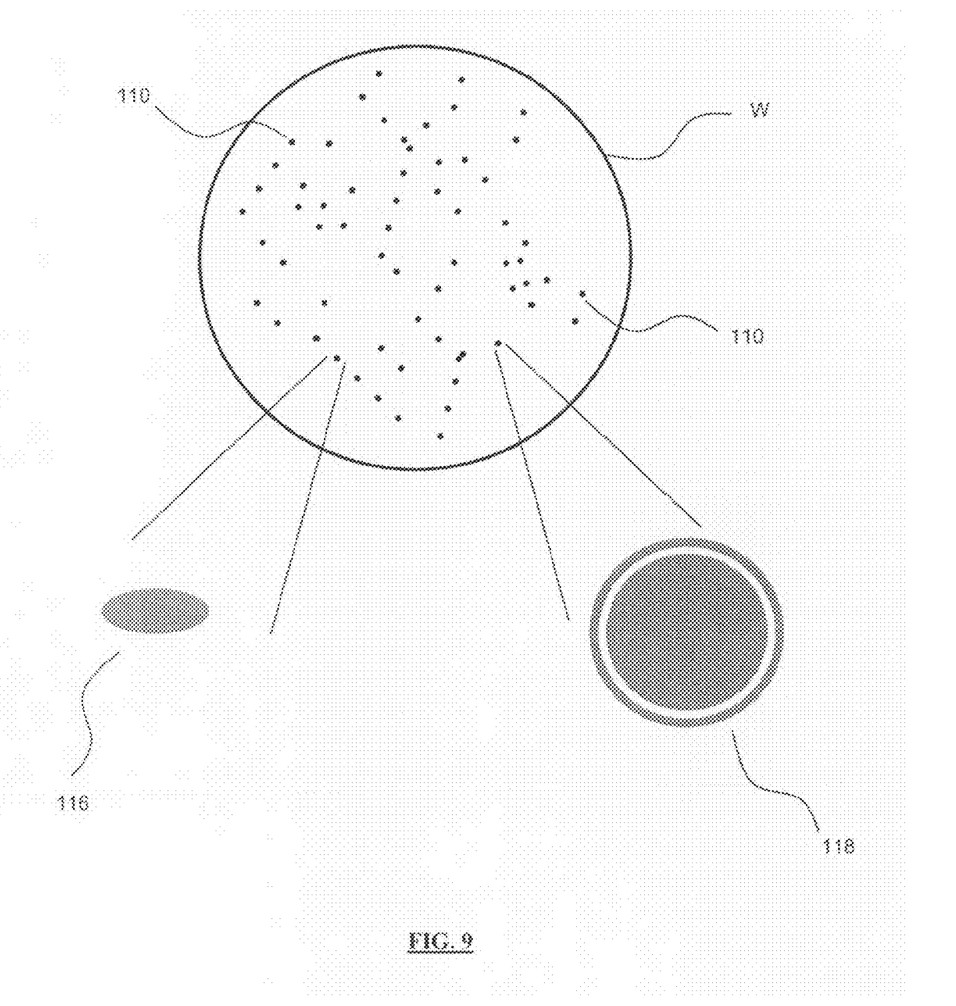
FIG. 9 schematically depicts a substrate in plan view together with a defect associated with the immersion lithography process shown in FIGS. 8a-8c.
Figure 10A:
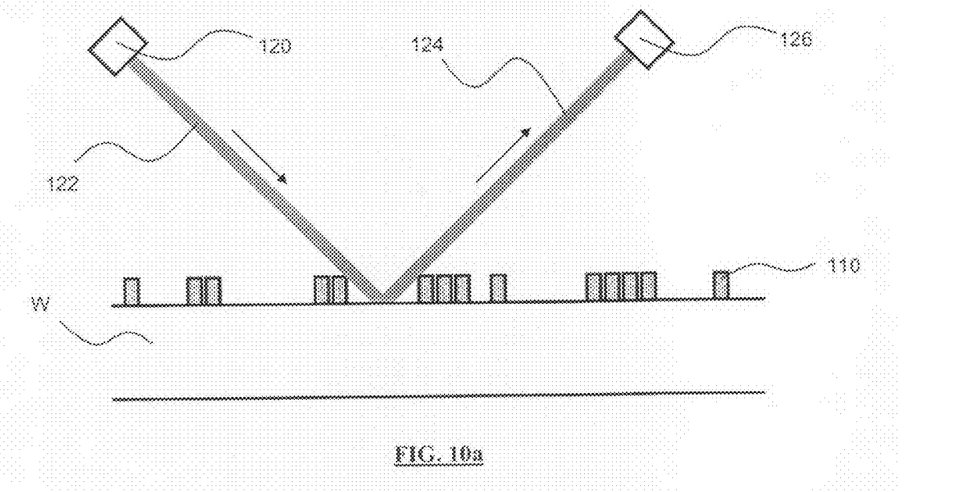
FIGS. 10a and 10b schematically depict an arrangement for obtaining information at least indicative of the defect shown in and described with reference to FIG. 9.
Figure 10B:
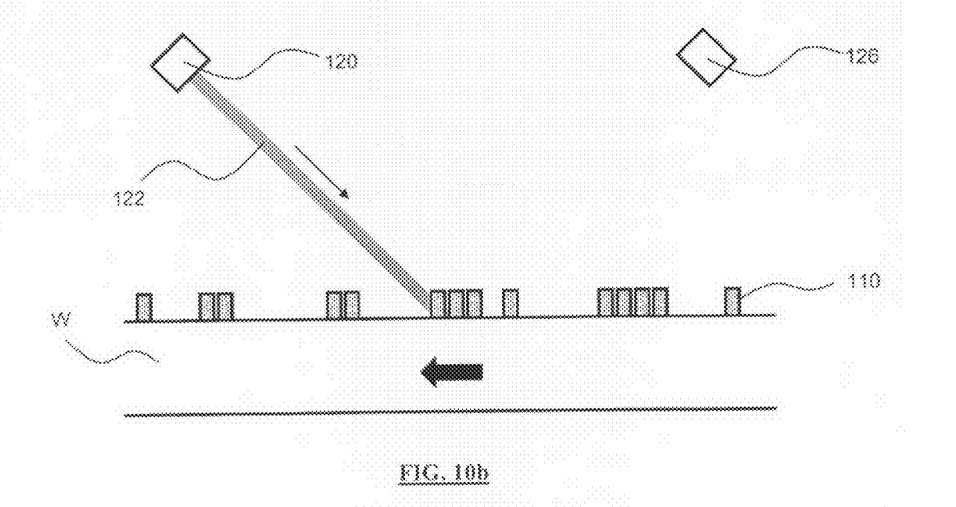

FIGS. 8 to 10 depict a method and apparatus for obtaining information related to a defect introduced in a layer of resist during an immersion lithography process in accordance with an embodiment of the present invention. FIG. 8a shows a substrate that is provided with a layer of resist 100. In contact with the layer of resist 100 is a volume of immersion fluid IFL. Located on the resist 100 are one or more bubbles 112 and contamination 114 which have arisen from interaction between the immersion fluid IFL and the resist 100.

FIG. 8b shows that the layer of resist is exposed to a non-patterned radiation beam. In other words, no pattern is introduced into the cross-section of the radiation beam (e.g., the radiation beam is not made to pass through or be reflected off a patterning device such as a mask). The non-patterned radiation beam 102 passes through the immersion fluid IFL and irradiates the resist. The bubbles 112 and contamination 114 prevent the non-patterned radiation beam 102 from irradiating a certain part of the resist. However, a part of the resist not covered by a bubble 112 or contamination 114 is exposed to and therefore irradiated by the radiation beam 102. The irradiated resist is exposed to a dose of radiation which is just sufficient to ensure that irradiated region is soluble to developer, and is therefore removed during subsequent development of the resist. This means that the presence of the bubbles 112 and the contamination 114 is enough to prevent the area of resist located beneath the bubbles 112 and contamination 114 from being given such a threshold dose and then be subsequently removed during the development process. For example, the resist may be exposed to a dose of radiation which is 0-10% greater than that which is just sufficient to ensure that an irradiated region is soluble to developer. A dose that is 5-10% greater may be desirable.

It can be seen from FIG. 8c that when the resist is developed, the only resist which remains on the substrate W is the resist 110 which was located beneath the bubbles 112 or contamination 114, and therefore not given enough energy to be soluble in the developer used in the development process. Since the radiation beam used to expose the resist was not patterned, all resist remaining on the substrate indicates the position, shape, size, number, etc. of defects. Furthermore, because no patterning device was used, and instead a non-patterned radiation beam was used, it can be assumed that no defects which have arisen are due to, for example, contamination on the patterning device.

FIG. 9 shows a plan view of the substrate W. It can be seen that on the substrate W there are a plurality of defects 110 which have been caused by exposing a layer of resist to a non-patterned radiation beam via an immersion fluid, as described with reference to FIGS. 8a to 8c. Closer inspection of the defects 110 can reveal more details as to their origin, for example the defects in the immersion lithography process which caused them. For instance, it may well be that further detailed inspection of a defect reveals that contamination has lead to a defect 116, or that a bubble has led to a defect 118.

Since a non-patterned radiation beam has been used to irradiate the resist, the only resist remaining on the substrate after development is resist which was not given sufficient energy to make it soluble in developer (i.e. the resist was not given a dose which is sometimes known as a "dose to clear"). This means that it is not necessary to compare images of different patterned areas of the resist in order to determine if a defect is present in an applied pattern. Instead, the surface of a substrate and/or the remaining resist can be scanned or analyzed using any appropriate arrangement, and any change in the topography of the substrate will reveal the position (and possibly the shape and detailed structure) of a defect. This apparatus can be anything suitable, for example a scanning beam, a scanning probe microscope, a scanning electron microscope, or anything which can obtain information at least indicative of the topography of features on a substrate. The arrangement can be moved relative to the substrate, or the substrate moved relative to the arrangement, in order to determine the topography of different parts of the resist and/or substrate. The scanning of the surface of the substrate to obtain topographical information can be undertaken very quickly, for example in one or two minutes or less.

FIGS. 10a and 10b illustrate an arrangement which may be used to determine the position, number, shape, size, etc. of resist features and therefore of one or more defects on a substrate. FIG. 10a shows a substrate W. Located on the substrate are defects 110 in the form of resist which was masked out from the non-patterned radiation beam by defects (e.g. a bubble, contamination, etc.) in the exposure process. A radiation beam generation component (e.g. a radiation source) 120 is shown emitting a beam of radiation 122 toward the substrate W. The radiation beam 122 is then shown as being redirected (e.g., reflected) 124 from the substrate W and toward a radiation detection component (e.g. a photodiode or photodiode array) 126. FIG. 10b shows that as the substrate W and/or radiation generation component 120 and radiation detection component 126 are moved relative to one another the radiation beam 122 is incident on different parts of the substrate W. This may cause the radiation beam 122 to be redirected 124 at different angles, to have a different intensity distribution, or for it not be redirected towards the detection component 126 at all. The changes in the redirected beam 124 can be used to determine the size, shape, number, position, etc. of the defects 110.

By scanning the radiation beam 122 relative to the substrate W, information regarding the topography of the entire surface of the substrate can be obtained, and therefore information regarding a defect on the substrate can be obtained. This information may be used to determine the exact number, and location of defects (e.g. a bubble, contamination, etc.) that was in the immersion fluid and/or on the resist during the immersion lithography process. This information can be used to determine how different exposure conditions, and/or different immersion fluids, for example, affect the number, location and type of defects. For instance, the described method can be undertaken when an immersion lithography apparatus is first installed or maintained, or when settings have been changed, in order to monitor the number and nature of the defects. Settings (e.g., field size, immersion fluid, dose, resist, etc.) may be changed and the method undertaken again to see if the number or nature of the defects change.

The use of a surface scanning arrangement is not essential. Information at least indicative of the topography of resist remaining on the substrate after the resist has been developed may be obtained using a camera or other imaging apparatus. Because no patterning device is used, and therefore no pattern is applied to the resist, all areas of resist left on the substrate may be attributed to a defect in the immersion lithography process. Therefore, for example, a camera with appropriate software could be used to obtain an image of the resist, and to then identify the number and/or location of the areas of resist. There is no need to compare images because the remaining resist will be attributable to a defect and not to a pattern in a patterning device.

Because a non-patterned radiation beam is used to expose the resist, there is no need to focus a radiation beam onto the patterning device or the substrate to obtain the defect information. This means that the time to focus the radiation beam is not required, thereby possibly increasing throughput.

Since no patterning device is used, there is no restriction as to the field size of the radiation beam when projected onto the substrate. The size of the field may therefore be readily changed by, for example, blocking out part of the radiation beam using one or more blades or the like, as is known in the art. This means that various different field sizes may be used when investigating a defect, and this may be useful when trying to determine for example if the field size has an effect on the number and nature of defects formed in the resist during the immersion lithography process.

Since there is no need to compare images of patterned areas of resist, much cheaper and quicker equipment may be used to obtain information related to a defect. This may reduce costs and increase throughput.

In the above examples, the irradiation of resist with a sufficient energy dose has been described as making the resist soluble in subsequent development. In other words, the resist described is a positive photo resist. It is to be appreciated that negative photo resist may be used instead or additionally. If negative photo resist is used, the defect in the immersion lithography process (e.g. a bubble, contamination, etc. in the immersion fluid) will still prevent an area of resist from being exposed to the non-patterned radiation beam. However, in contrast to the situation where a positive photo resist is used, if a negative photo resist is used then the exposed area of resist will become insoluble in subsequent development. This means that using a negative photo resist, after subsequent development, the position of a defect will not be identifiable by an area (e.g. a pillar) of resist, but by an area (e.g., a notch, trench or the like) where resist is not present (in other words, an area surrounded by resist). A surface scanning apparatus as described above can still be used to determine the position of an area where resist is not present, and therefore the position, size, number, shape, etc. of defects as described above.

In the foregoing description, the development of resist has been described. This may be achieved using any suitable apparatus, as is known in the art. For instance, the resist coated substrate may be immersed in a volume of developer. Alternatively or additionally, developer may be deposited on the resist, and the substrate spun to spread the developer across all or part of the resist.

The use of photo resist is not essential. Any radiation sensitive material may be used.

An embodiment of the present invention has been described in relation to an immersion system optimized for supplying an immersion liquid. However, an embodiment of the present invention is equally applicable for use with an immersion system that uses a fluid supply system supplying a fluid other than a liquid as the immersion medium.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or a data storage medium (e.g. semiconductor memory, magnetic or optical disk) having such a computer program stored therein. One or more controllers may be provided to control the apparatus, each controller having a processor. The controllers may operate the apparatus according to the one or more computer programs embodying the invention.

One or more embodiments of the invention may be applied to any immersion lithography apparatus, in particular, but not exclusively, those types mentioned above and whether the immersion liquid is provided in the form of a bath, is confined to a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used, although they should be considered more generically. It is intended that such terms should also extend to other high refractive index liquids which may be used, such as fluorine containing hydrocarbons.

The descriptions above are intended to be illustrative, not limiting. Thus, it will be apparent to one skilled in the art that modifications may be made to the invention as described without departing from the scope of the claims set out below.

The invention claimed is:

1. A method of obtaining information related to a defect present in the irradiation of a substrate coated with a layer of radiation sensitive material using immersion lithography, the method comprising:
    irradiating an area of the radiation sensitive material with a non-patterned radiation beam, the area being irradiated with a dose which is sufficient for the radiation sensitive material to be substantially removed during subsequent development of the radiation sensitive material if the radiation sensitive material is a positive radiation sensitive material, or with a dose which is sufficient for the radiation sensitive material to be substantially insoluble during subsequent development of the radiation sensitive material if the radiation sensitive material is a negative radiation sensitive material, such that a first part of the radiation sensitive material is sufficiently soluble for the part of the radiation sensitive material to be substantially removed during subsequent development and a second part of the radiation sensitive material is insoluble during subsequent development;
    developing the radiation sensitive material to remove the first part of the radiation sensitive material; and
    obtaining information at least indicative of the topography of the second part of the radiation sensitive material remaining on the substrate after the radiation sensitive material has been developed in order to obtain information related to the defect.

2. The method as claimed in claim 1, wherein the dose is equal to that required for:
    the irradiated radiation sensitive material to be substantially removed during subsequent development of the radiation sensitive material if the radiation sensitive material is a positive radiation sensitive material; or the irradiated radiation sensitive material to be substantially insoluble during subsequent development of the radiation sensitive material if the radiation sensitive material is a negative radiation sensitive material.

3. The method as claimed in claim 1, wherein the dose is greater than that required for:
the irradiated radiation sensitive material to be substantially removed during subsequent development of the radiation sensitive material if the radiation sensitive material is a positive radiation sensitive material; or
the irradiated radiation sensitive material to be substantially insoluble during subsequent development of the radiation sensitive material if the radiation sensitive material is a negative radiation sensitive material.

4. The method as claimed in claim 3, wherein the dose is between 0% and 10% greater.

5. The method as claimed in claim 3, wherein the dose is between 5% and 10% greater.

6. The method as claimed in claim 1, wherein the information indicative of the topography of the radiation sensitive material is obtained using an arrangement, and wherein the method comprises moving the substrate, at least a part of the arrangement, or both the substrate and the at least part of the arrangement, relative to each other to obtain information at least indicative of the topography of different areas of radiation sensitive material on the substrate.

7. The method as claimed in claim 6, wherein the arrangement is or comprises a surface scanning element.

8. The method as claimed in claim 6, wherein the arrangement comprises a scanning electron microscope, an atomic force microscope, a scanning probe microscope, or a scanning force microscope.

9. The method as claimed in claim 1, wherein the information indicative of the topography of the radiation sensitive material is obtained, at least in part, by detecting changes in a beam of radiation that has been redirected from the substrate and/or radiation sensitive material.

10. The method as claimed in claim 9, comprising moving i) a radiation beam generation component, or ii) a radiation beam detection component, or iii) an incident radiation beam, or iv) the substrate, or v) any combination selected from i)-iv).

11. The method as claimed in claim 9, wherein the changes comprise:
a change in the angle of redirection of the redirected radiation beam;
a change in the intensity or intensity distribution of the redirected radiation beam; or
the detection or non-detection of the redirected radiation beam.

12. The method as claimed in claim 1, wherein the information indicative of the topography of the radiation sensitive material comprises:
the position or positions of an area or areas of radiation sensitive material;
the number of areas of radiation sensitive material;
the size or sizes of the area or areas of radiation sensitive material; or
the shape or shapes of the area or areas of radiation sensitive material.

13. The method as claimed in claim 12, wherein the position, number, size or shape of the area or areas of radiation sensitive material correspond to the position, number, size or shape of one or more bubbles, one or more fluid marks or contamination which caused the area or areas of radiation sensitive material to remain on the substrate during development.

14. The method as claimed in claim 13, wherein the bubble, fluid mark or contamination was present in a volume of immersion fluid used during the immersion lithography process, or on the layer of radiation sensitive material, during the immersion lithography process.

15. The method as claimed in claim 1, wherein the information indicative of the topography of the radiation sensitive material comprises:
the position or positions of an area or areas surrounded by radiation sensitive material;
the number of areas surrounded by radiation sensitive material;
the size or sizes of the area or areas surrounded by radiation sensitive material; or
the shape or shapes of the area or areas surrounded by radiation sensitive material.

16. The method as claimed in claim 15, wherein the position, number, size or shape of the area or areas surrounded by radiation sensitive material correspond to the position, number, size or shape of one or more bubbles, one or more fluid marks or contamination which caused an area or areas of radiation sensitive material to be removed from the substrate during development to leave an area or areas surrounded by radiation sensitive material.

17. The method as claimed in claim 16, wherein the bubble, fluid mark or contamination was present in a volume of immersion fluid used during the immersion lithography process, or on the layer of radiation sensitive material, during the immersion lithography process.

18. The method as claimed in claim 1, wherein the radiation sensitive material is a photo resist.

* * * * *